(12) United States Patent
Kurabe et al.

(10) Patent No.: US 6,291,081 B1
(45) Date of Patent: Sep. 18, 2001

(54) ELECTRODEPOSITED COPPER FOIL WITH ITS SURFACE PREPARED, PROCESS FOR PRODUCING THE SAME AND USE THEREOF

(75) Inventors: Hitoshi Kurabe; Mitsuhito Shibata; Masakazu Mitsuhashi, all of Ageo (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 0 days.

(21) Appl. No.: 09/652,642

(22) Filed: Aug. 31, 2000

(30) Foreign Application Priority Data

Aug. 31, 1999 (JP) .................................................. 11-244882

(51) Int. Cl.[7] ............................. B32B 15/20; H05K 1/09; H05K 3/00; B24B 1/00
(52) U.S. Cl. ......................... 428/606; 428/607; 428/626; 428/687; 174/257; 451/57
(58) Field of Search ..................................... 428/606, 600, 428/607, 626, 687, 623; 205/111, 206, 222, 917, 77; 174/256, 259, 257; 451/57, 58, 37

(56) References Cited

U.S. PATENT DOCUMENTS

| 5,096,522 | * | 3/1992 | Kawachi et al. ...................... 156/151 |
| 5,437,914 | * | 8/1995 | Saida et al. ............................ 428/209 |
| 5,545,466 | * | 8/1996 | Saida et al. ............................ 428/209 |
| 5,858,517 | * | 1/1999 | Tagusari et al. ...................... 428/209 |
| 5,897,761 | * | 4/1999 | Tagusari et al. ...................... 205/77 |

FOREIGN PATENT DOCUMENTS

| 3-296238 | 12/1991 | (JP) . |
| 05160208 | 6/1993 | (JP) . |
| 9-195096 | * | 7/1997 | (JP) . |

* cited by examiner

*Primary Examiner*—John J. Zimmerman
(74) *Attorney, Agent, or Firm*—Webb Ziesenheim Logsdon Orkin & Hanson, P.C.

(57) ABSTRACT

A process for producing an electrodeposited copper foil with its surface prepared, comprising the steps of: subjecting an electrodeposited copper foil having a shiny side and a matte side whose average surface roughness (Rz) is in the range of 2.5 to 10 μm to the first mechanical polishing so that the average surface roughness (Rz) of the matte side becomes 1.5 to 6 μm; and subjecting the matte side having undergone the first mechanical polishing to at least one further mechanical polishing so that the average surface roughness (Rz) of the matte side becomes 1.0 to 3.0 μm. The protrudent parts of the matte side are selectively polished by the first mechanical polishing, and the surface having undergone the first mechanical polishing is further subjected to the second and any ensuing mechanical polishings under milder conditions. Thus, a highly planar polished face with excellent surface properties can be obtained. Moreover, depressed parts are not polished, so that the amount of copper lost by the polishings is extremely minute. The use of the electrodeposited copper foil with its surface prepared according to the present invention enables forming a wiring pattern of extremely fine pitch.

20 Claims, 6 Drawing Sheets

(A) Direction of Buff Rotation →

112  112
Copper Foil

(B) 111  111

(C) Direction of Buff Rotation ←

18μm-VLP (M Side)

Fig.8

1st Buff Polishing (M Side)

Fig.9

2nd Buff Polishing (M Side)

Fig.10

Surface after 2nd Buff Polishing + Treatment

ELECTRODEPOSITED COPPER FOIL WITH ITS SURFACE PREPARED, PROCESS FOR PRODUCING THE SAME AND USE THEREOF

FIELD OF THE INVENTION

The present invention relates generally to an electrodeposited copper foil with its surface prepared wherein a matte side, namely a surface at which copper electrodeposition is completed, is mechanically polished at least twice so as to attain preparing thereof, and relates to a process for producing the same and a use of the electrodeposited copper foil with its surface prepared in, for example, a printed wiring board.

BACKGROUND OF THE INVENTION

In recent years, both the size and weight of electronic equipment such as a notebook-sized personal computer are being reduced to increasing extents. Accordingly, IC wiring is also becoming finer.

With respect to the wiring pattern formed on a substrate used in such an electronic equipment, the lead width is now as small as ten-odd microns ($\mu$m). In accordance therewith, the metal foil constituting the wiring pattern is becoming thinner. Specifically, while the designated thickness of metal foil for use in the formation of the conventional wiring pattern of about 100 $\mu$m lead width has ranged from about 15 to 35 $\mu$m in correspondence to the width of the wiring pattern, the thickness of metal foil employed in the formation of ten-odd micron ($\mu$m) wiring pattern must be reduced in correspondence thereto.

For example, an aluminum foil or a copper foil is used as the metal foil for constituting the above wiring pattern. It is preferred to employ a copper foil, especially an electrodeposited copper foil, as the metal foil.

The electrodeposited copper foil employed for forming the above wiring pattern is produced by electrodepositing copper on a drum surface. With respect to the thus produced electrodeposited copper foil, the surface at which copper deposition is initiated, namely the surface in contact with the drum, is referred to as "shiny side", and the surface at which copper deposition is completed is referred to as "matte side". The surface condition of the shiny side is substantially the same as that of the drum. That is, the 10-point average surface roughness (Rz) of the drum is about from 1.2 to 2.5 $\mu$m, to which the 10-point average surface roughness of the shiny side is nearly equal. On the other hand, with respect to the matte side, its surface roughness is greater than the surface roughness of the shiny side, and the 10-point average surface roughness of the matte side, although varied depending on the deposition condition of copper and the thickness thereof, is generally in the range of about 2.5 to 10 $\mu$m. In the conventional electrodeposited copper foil of about 35 $\mu$m nominal thickness, it has been rare that the surface roughness of the matte side poses a problem. However, in the electrodeposited copper foil of ten-odd micron ($\mu$m) thickness, the surface roughness of the matte side is equivalent to tens of percents of the thickness of the whole electrodeposited copper foil, and the condition of the matte side exerts marked influence on the electrical properties of formed wiring pattern and board per se. It is known that, for example, mechanical polishing, chemical polishing and electrolytic polishing are available as the means for preparing the state of surface of the copper foil. The mechanical polishing is a method of smoothing the surface of the copper foil with the use of, for example, a buff. When use is made of a thin copper foil, the copper foil may be broken by mechanical stress exerted on the copper foil. Thus, the mechanical polishing is suitable for the conditioning of the surface of relatively thick copper foils. On the other hand, no mechanical stress is exerted on the copper foil in the chemical polishing and electrolytic polishing, as different from the mechanical polishing, so that even relatively thin copper foils would not be broken by the chemical polishing and electrolytic polishing. Thus, it has been believed that the chemical polishing and electrolytic polishing are suitable for the preparing (conditioning) of the surface of relatively thin copper foils.

For example, Japanese Patent Application Publication (Unexamined) No. Hei 5-160208 discloses a tape carrier having a lead pattern formed from an electrodeposited copper foil wherein the overall surface of matte side obtained by electrodeposition has been prepared (conditioned). This publication discloses the use, in the formation of a lead pattern of 60 to 80 $\mu$m pitch, of an electrodeposited copper foil whose matte side surface of 1–2 $\mu$m has been chemically polished. The thickness of the there employed electrodeposited copper foil after the polishing is in the range of 18 to 30 $\mu$m. It is disclosed that a highly reliable carrier tape with desired lead strength can be provided by the use of the copper foil whose matte side overall surface has been chemically polished.

However, the preparing of copper foil by chemical polishing as described in the above publication, although protrudent parts of the matte side are leached with relatively high selectivity to thereby effect preparing thereof, also invites leaching of the copper constituting the depressed parts of the matte side. Therefore, in this chemical polishing, the whole copper foil tends to become thin. Accordingly, when the thin electrodeposited copper foil employed in conformity with the recent trend toward fine pitch, for example, the electrodeposited copper foil having a thickness of 35 $\mu$m (1 ounce), or 17.5 $\mu$m (½ounce), or less is chemically polished, the whole electrodeposited copper foil is thinned to such an extent that the mechanical strength of wiring pattern or lead is poor. Further, when it is intended to carry out this chemical polishing, first, the shiny side is coated with a resist to thereby protect the same. Subsequently, the matte side is treated with a copper corrosive solution such as ferric chloride. After the treatment, the resist must be removed from the shiny side. Therefore, the preparing procedure is extremely time-consuming. Further, this chemical polishing poses a problem such that it is difficult to control a chemical polishing reaction so as to have the matte side uniformly treated. These problems of chemical polishing also occur in the electrolytic polishing involving leaching of copper.

Moreover, Japanese Patent Application Publication (Unexamined) No. Hei 3-296238 discloses a method of producing a TAB tape having a wiring pattern formed from a non-treated copper foil. The average surface roughness of the non-treated copper foil is described as falling within the range of 0.01 to 1 $\mu$m.

However, the non-treated copper foil whose average surface roughness (Rz) falls within the range of 0.01 to 1 $\mu$m, disclosed in this publication, is a rolled copper foil. The surface roughness of this non-treated rolled copper foil is too low to ensure sufficient peel strength (bonding strength). Accordingly, it is needed to preheat the copper foil or increase the diameter of the roller so as to form a covering film of cuprous oxide on the surface of the rolled copper foil. This poses a problem such that the process becomes laborious. Further, the use of this rolled copper foil renders it difficult to form a wiring pattern of extremely fine pitch such as one of not less than 30 μm and less than 60 μm pitch width.

Still further, Japanese Patent Application Publication (Unexamined) No. Hei 9-195096 discloses an invention directed to an electrodeposited copper foil for printed wiring board characterized in that the surface roughness (Rz) of the matte side of electrodeposited copper foil prior to nodulating treatment is not greater than 1.5 μm while the surface roughness (Rz) after nodulating treatment on the matte side is in the range of 1.5 to 2.0 μm. This electrodeposited copper foil is described as being producible by a method comprising buffing the matte side of an electrodeposited copper foil so as to cause the surface roughness (Rz) prior to nodulating treatment to become 1.5 μm or less and subsequently effecting a nodulating treatment on the matte side so as to cause the surface roughness (Rz) to become 1.5 to 2 μm.

However, the buffing as described in this publication may cause streaks on the buffed surface. These streaks result from polishing made deeper than predetermined. Some streaks have not posed any problem when use is made of the conventional thick electrodeposited copper foils. However, these streak portions indicate excess polishing of copper, so that, when use is made of thin copper foils, the mechanical strength of streak portions is extremely small. Thus, these are likely to become the cause of defective occurrence, for example, high possibility of open circuit at such portions in a wiring pattern or the like. Furthermore, in the execution of such buffing, stress is exerted on protrudent parts of the copper foil surface along the direction of buff rotation, so that protrudent parts of the copper foil surface are likely to deform along the direction of buff rotation. It is difficult to effect uniform nodulating treatment on the buffed copper foil having thus deformed protrudent parts. Nonuniform nodulating treatment would invite problems such that the lamination to insulating films, etching uniformity, bonding reliability, etc. are deteriorated. These problems are likely to occur especially when thin electrodeposited copper foils are mechanically polished.

OBJECT OF THE INVENTION

An object of the present invention is to provide an electrodeposited copper foil with its surface prepared which is suitable for realization of fine pitch.

Another object of the present invention is to provide an electrodeposited copper foil with its surface prepared, which is producible by effecting such a mechanical polishing that protrudent parts of the matte side are selectively polished while minimizing the deformation, etc. of electrodeposited copper foil by the mechanical polishing. Further objects of the present invention are to provide a method of surface preparing and uses of the electrodeposited copper foil with its surface prepared.

SUMMARY OF THE INVENTION

The process for producing an electrodeposited copper foil with its surface prepared according to the present invention comprises the steps of:

subjecting an electrodeposited copper foil having a shiny side and a matte side whose average surface roughness (Rz) is in the range of 2.5 to 10 μm to the first mechanical polishing so that the average surface roughness (Rz) of the matte side becomes 1.5 to 6 μm, and subjecting the matte side having undergone the first mechanical polishing to at least one further mechanical polishing so that the average surface roughness (Rz) of the matte side becomes 1.0 to 3.0 μm.

The electrodeposited copper foil with its surface prepared according to the present invention is one having a shiny side and a prepared matte side whose average surface roughness (Rz) is in the range of 1.0 to 3.0 μm, the above prepared matte side obtained through the steps of subjecting a matte side of electrodeposited copper foil whose average surface roughness (Rz) is in the range of 2.5 to 10 μm to the first mechanical polishing so that the average surface roughness of the matte side becomes 1.5 to 6 μm, and subjecting the matte side having undergone the first mechanical polishing to at least one further mechanical polishing so that the average surface roughness (Rz) of the matte side becomes in the range of 1.0 to 3.0 μm.

The printed wiring board of the present invention comprises an insulating substrate having its surface furnished with a wiring pattern formed from an electrodeposited copper foil with its surface prepared, this electrodeposited copper foil with its surface prepared having a shiny side and a prepared matte side whose average surface roughness (Rz) is in the range of 1.0 to 3.0 μm, the prepared matte side obtained through the steps of subjecting a matte side of electrodeposited copper foil whose average surface roughness (Rz) is in the range of 2.5 to 10 μm to a mechanical polishing so that the average surface roughness (Rz) of the matte side becomes in the range of 1.5 to 6 μm, and subjecting the matte side having undergone the mechanical polishing to at least one further mechanical polishing so that the average surface roughness (Rz) of the matte side becomes in the range of 1.0 to 3.0 μm.

The multi-layer printed wiring board of the present invention comprises a laminate of a plurality of boards of given thickness, the above boards capable of being electrically connected to each other in the direction of the thickness of the laminate, each of the boards having its surface furnished with a wiring pattern formed from an electrodeposited copper foil with its surface prepared, this electrodeposited copper foil with its surface prepared having a shiny side and a prepared matte side whose average surface roughness (Rz) is in the range of 1.0 to 3.0 μm, the prepared matte side obtained through the steps of subjecting a matte side of electrodeposited copper foil whose average surface roughness (Rz) is in the range of 2.5 to 10 μm to a mechanical polishing so that the average surface roughness (Rz) of the matte side becomes in the range of 1.5 to 6 μm, and subjecting the matte side having undergone the mechanical polishing to at least one further mechanical polishing so that the average surface roughness (Rz) of the matte side becomes in the range of 1.0 to 3.0 μm.

In the present invention, it is preferable that the electrodeposited copper foil with its surface prepared is so prepared that the matte side having undergone at least the second mechanical polishing for counter direction of the first polishing direction has its surface furnished substantially without shelf shaped deformation.

In the present invention, the matte side of an electrodeposited copper foil is subjected to at least two mechanical polishings to thereby attain polishing thereof. By virtue of a plurality of mechanical polishings, instead of one mechanical polishing, of the matte side, stress exerted on the electrodeposited copper foil is reduced even when use is made of a thin electrodeposited copper foil. Thus, not only is the electrodeposited copper foil free from breakage but also there is substantially no deformation of the protrudent parts attributed to stress because the stress is slight. In particular, when the matte side of the electrodeposited copper foil is polished with the use of a plurality of rotary buffs which are rotated in mutually reverse directions, the matte side can be prepared smoothly and uniformly. In these mechanical polishings, it is not needed to protect the shiny side not to be polished as different from the chemical polishing and electrolytic polishing.

Fine particles of copper with substantially identical diameters can be uniformly electrodeposited on the polished matte side surface by performing a nodulating treatment (roughening treatment) on the matte side having undergone a plurality of mechanical polishings as mentioned above. Thus, extremely steady bonding of the electrodeposited copper foil to an insulating film can be accomplished by arranging the obtained electrodeposited copper foil with its surface prepared so that the matte side thereof is opposite to a surface of insulating film and by effecting thermocompression thereof.

Furthermore, the amount of copper foil surface polished per mechanical polishing can be reduced by virtue of a plurality of mechanical polishings to thereby enable avoiding the occurrence of, for example, streak by excess polishing.

DETAILED DESCRIPTION OF THE INVENTION

The electrodeposited copper foil with its surface prepared according to the present invention will be described in detail below with reference to the drawings. In the drawings, like reference numerals are used to designate like or corresponding members, if possible, throughout the several views.

An electrodeposited copper foil having a designated average thickness of 18 $\mu$m prior to mechanical polishings (referred to as "18 $\mu$m thick electrodeposited copper foil"), set forth in the description of the invention by way of an example, has an average surface roughness ($Rz_0$) of matte side ranging from about 2.5 to 10 $\mu$m, preferably about 3 to 8 $\mu$m. Even with respect to electrodeposited copper foils of small surface roughness, the average surface roughess ($Rz_0$) of matte side is in the range of about 3 to 7 $\mu$m. Examples of copper foils having such an average surface roughness include VLP foil (average surface roughness (Rz): 3 to 5 $\mu$m) and HTE foil (average surface roughness (Rz): 4 to 7 $\mu$m).

Figure 1:
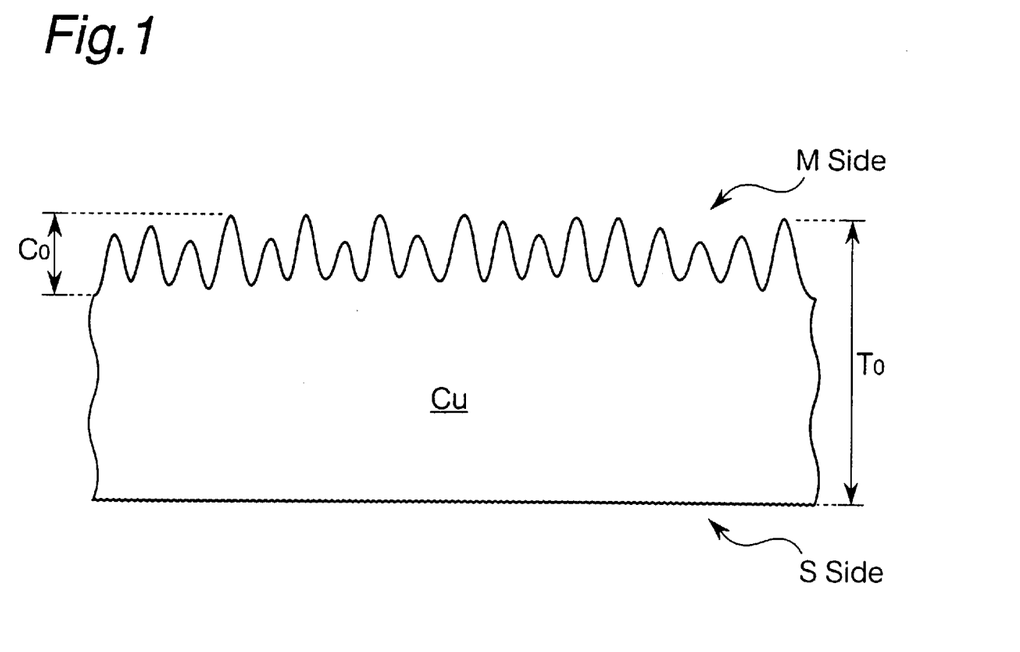
FIG. 1 is a schematic sectional view of one form of a matte side of a conventional electrodeposited copper foil.
Figure 2:
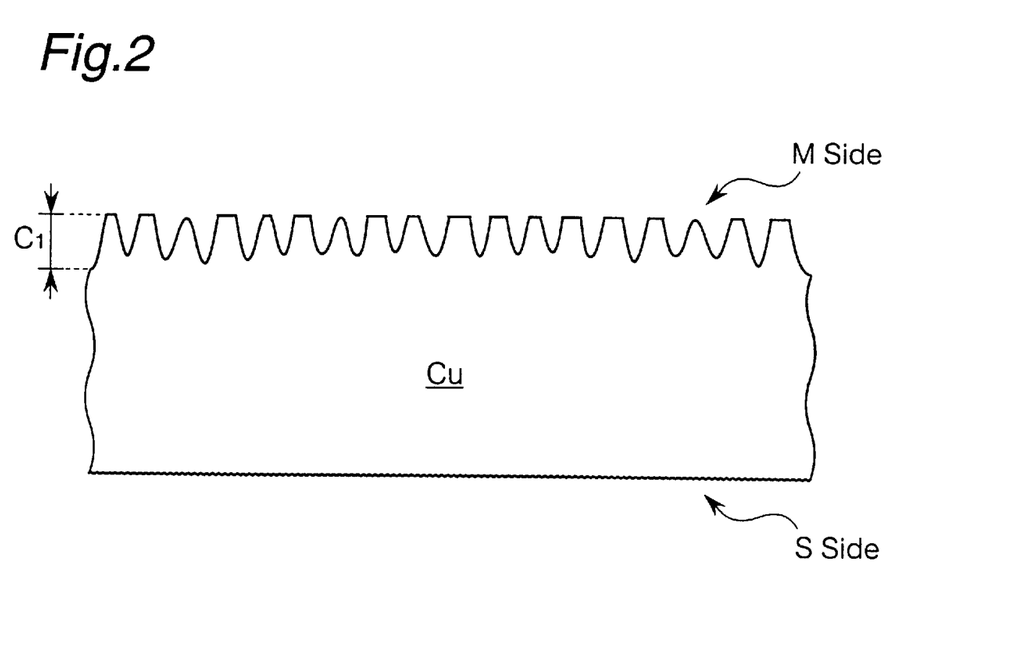
FIG. 2 is a schematic sectional view showing the state of the matte side having undergone a first buffing.
Figure 3:
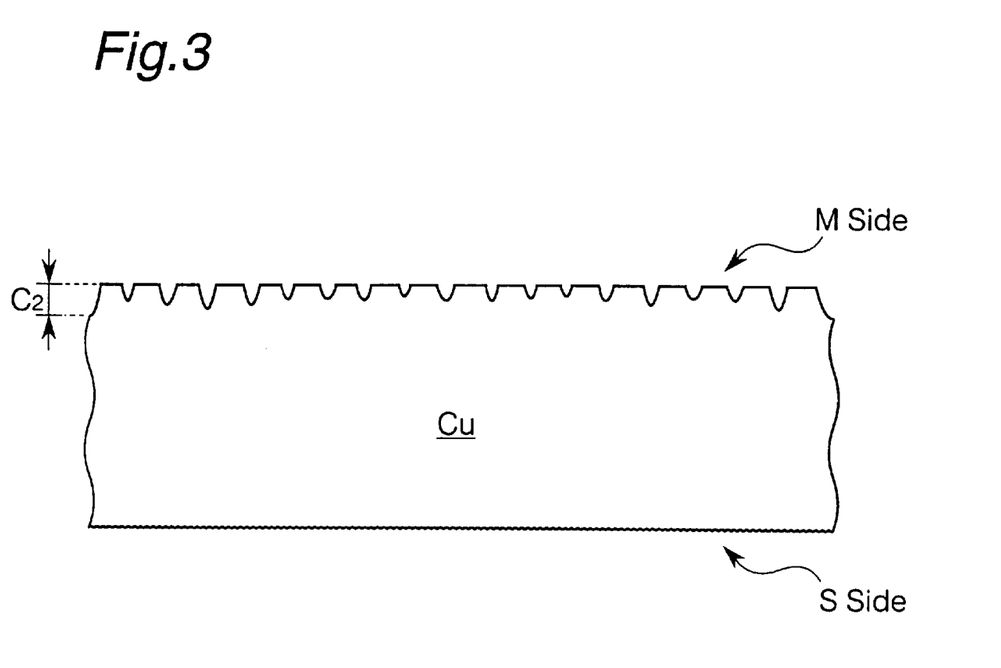
FIG. 3 is a schematic sectional view showing the state of the matte side having undergone a second buffing.

FIG. 1 is a sectional view schematically showing the common surface condition of the matte side of an electrodeposited copper foil having a gauge thickness ($T_0$) of 18 $\mu$m and an average surface roughness ($Rz_0$) of 4.5 $\mu$m. FIG. 2 is a schematic sectional view of the electrodeposited copper foil having its surface prepared so as to have an average surface roughness ($Rz_1$) of 1.5 $\mu$m by the first mechanical polishing. FIG. 3 is a schematic sectional view of the electrodeposited copper foil having its surface prepared so as to have an average surface roughness ($Rz_2$) of 1.0 $\mu$m by the second mechanical polishing.

Figure 7:
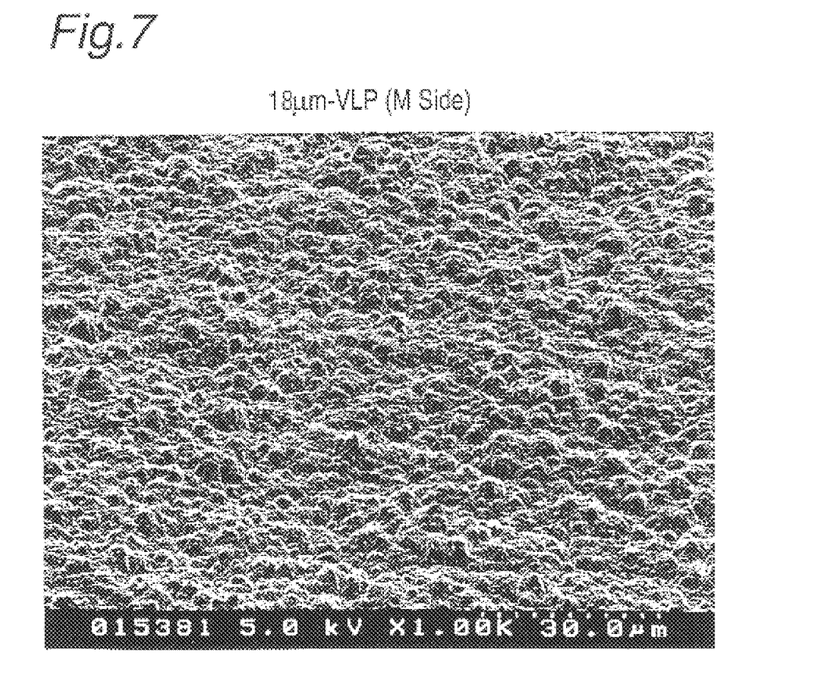
FIG. 7 is a Scanning Electron Micrometer (SEM) photograph showing one form of the matte side of an 18 $\mu$m thick electrodeposited copper foil prior to mechanical polishings.

FIG. 7 is an electron micrograph showing the matte side of the 18 $\mu$m thick electrodeposited copper foil prior to mechanical polishings.

In FIGS. 1 through 3, the designation "M side" means the matte side of the electrodeposited copper foil, and the designation "S side" means the shiny side of the electrodeposited copper foil. Referring to FIG. 1, generally, the average surface roughness of the matte side is expressed by a 10-point average surface roughness (Rz) of the matte side. The 10-point average surface roughness (Rz) is, as shown in ISO 4287, an average of 10-point roughness consisting of five largest values and five smallest values selected from among the lengths from depressed part bottom to protrudent part apex at a multiplicity of points of the matte side. The unevenness formed at the matte side is not uniform, and the distance from the deepest bottom of depressed parts to the highest apex of protrudent parts ($C_0$) is about 6 $\mu$m even in the electrodeposited copper foil whose average surface roughness ($Rz_0$) is 4.5 $\mu$m.

In the present invention, referring to FIG. 2, the first mechanical polishing mainly polishes apex portions of the protrudent parts of the matte side. This first mechanical polishing causes the average surface roughness ($Rz_1$) of the matte side of the electrodeposited copper foil to generally fall within the range of 1.5 to 6 $\mu$m, preferably 1.5 to 3.5 $\mu$m, and especially preferably 1.5 to 2.5 $\mu$m.

This first mechanical polishing can be accomplished by the use of, for example, a rotary buff.

Specifically, while the electrodeposited copper foil to be polished is being passed through guide rolls, a rotary buff for carrying out the first mechanical polishing is arranged against the matte side thereof to thereby effect intended polishing.

In this first buffing, the buff is rotated in a single direction at a rotating speed of generally 100 to 1500 rpm, preferably 800 to 1300 rpm, to thereby effect intended mechanical polishing. When the rotating speed of the buff is less than 100 rpm, it may be difficult to uniformly polish the matte side to be polished. On the other hand, when the rotating speed is much greater than 1500 rpm, the buff rotation becomes unstable, so that the electrodeposited copper foil may be broken.

Although the press force exerted by the buff upon the copper foil to be polished in the first buffing can be appropriately regulated so as to avoid breakage of the electrodeposited copper foil and simultaneously avoid excess polishing of the matte side by the first buffing, it is preferred that the press force be maximized in the first buffing and be sequentially lowered in ensuing buffings. Generally, the buff press force is controlled by the load current of a buff rotation driving motor. In the present invention, the first buff press force in terms of buff motor rotation driving current value is set so as fall within the range of 19 to 30 A (the buff motor current value at the time of non-load is about 10 A, so that the substantial press force of first buffing in terms of buff motor current value is in the range of 9 to 20 A). When the press force in terms of buff motor current value exceeds 20 A, breakage of the electrodeposited copper foil becomes frequent. On the other hand, when the press force is less than 9 A, either polishing of the electrodeposited copper foil is not effective, or the time require for polishing is prolonged.

When the electrodeposited copper foil is mechanically polished by the above rotary buff, the speed at which the copper foil to be polished is moved, namely the line speed, is generally set so as to fall within the range of range of range 3 to 15 m/min. This line speed may influence the uniformity of mechanical polishing. When the line speed falls outside the above range, it is likely for the uniformity of mechanical polishing to be deteriorated.

The first mechanical polishing is generally carried out by the use of the rotary buff. In this mechanical polishing, for example, in the use of the buff, the employed polishing material, although the type thereof is not particularly limited, can be, for example, a buff material of No. 400 to 1200 or so, preferably No. 800 to 1200 or so, having aluminum oxide bonded thereto.

The above first mechanical polishing selectively polishes relatively high apex portions of the protrudent parts of the matte side. For example, polishing is performed so as to realize a reduction of $C_0=6$ $\mu$m for which reference is made to FIG. 1 to $C_1=3$ $\mu$m for which reference is made to FIG. 2. That is, the first polishing causes $C_1$ to realize a reduction of 30 to 50% relative to the $C_0$ prior to surface preparing. When the thus performed first polishing is evaluated by the average surface roughness (Rz), for example, with respect to the electrodeposited copper foil of FIG. 1, the original average surface roughess ($Rz_0$) is 4.5 $\mu$m, and the first mechanical polishing reduces the same to an average surface roughness ($Rz_1$) of 2.5 $\mu$m as shown in FIG. 2. Thus, the first mechanical polishing lowers the average surface roughness (Rz) by 40 to 60%.

Figure 8:
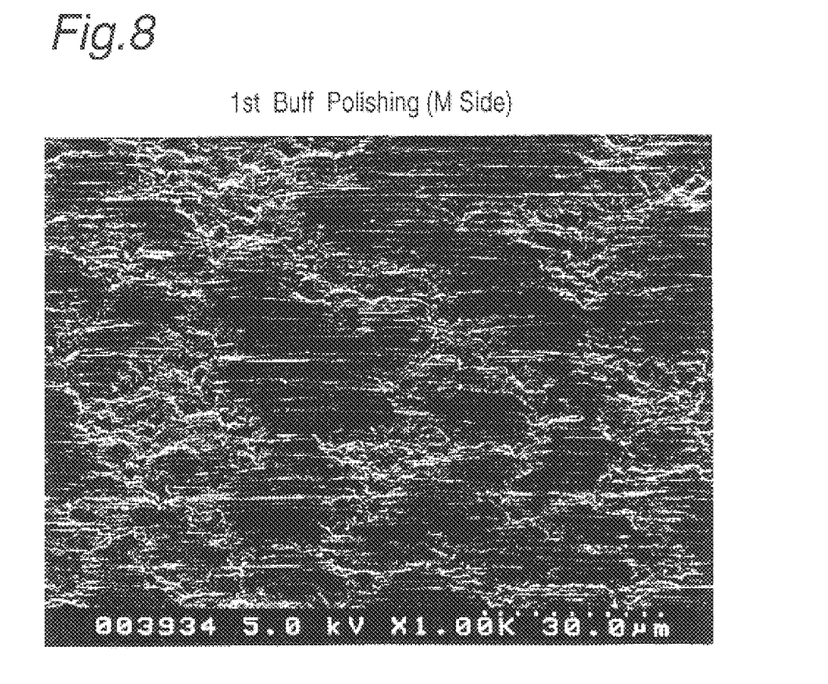
FIG. 8 is an SEM photograph showing one form of the matte side of an 18 $\mu$m thick electrodeposited copper foil having undergone the first mechanical polishing.

FIG. 8 is an SEM photograph showing the matte side of the 18 $\mu$m thick electrodeposited copper foil having undergone the first mechanical polishing.

The copper foil having apex portions of the protrudent parts selectively polished by the first mechanical polishing is subjected further to the second mechanical polishing.

When a plurality of mechanical polishings are performed as mentioned above, it is advantageous to carry out the first mechanical polishing and the second mechanical polishing on a continuous line. Thus, the line speed is generally the same as in the first mechanical polishing, and generally set so as to fall within the range of 3 to 15 m/min.

In the second mechanical polishing, referring to FIG. 2, the matte side of the electrodeposited copper foil which has mainly apex portions of the protrudent parts of the matte side selectively polished is further polished.

Referring to FIG. 2, although the first polishing attains a distance reduction of about 30 to 50% from the $C_0$ prior to mechanical polishings to $C_1$, there are quite some protrudent parts which have not been brought into contact with the rotary buff in the first polishing at the matte side of the electrodeposited copper foil.

The second mechanical polishing of the present invention, referring now to FIG. 3, accomplishes mechanical polishing of deeper portions including the above apex portions of protrudent parts which remain in unpolished form.

That is, although the first mechanical polishing mainly polishes apex portions of the protrudent parts, in the second mechanical polishing, the matte side of electrodeposited copper foil whose average surface roughness ($Rz_1$) has been caused to generally fall within the range of 1.5 to 6 $\mu$m, preferably 1.5 to 3.5 $\mu$m, and especially preferably 1.5 to 2.5 $\mu$m, by the first mechanical polishing is further mechanically polished so that, referring to FIG. 3, the average surface roughness ($Rz_2$) generally falls within the range of 1.0 to 3.0 $\mu$m, preferably 1.0 to 1.5 $\mu$m, and especially preferably 1.0 to 1.2 $\mu$m.

This second mechanical polishing can be accomplished by the use of, for example, a rotary buff.

Specifically, while the electrodeposited copper foil having been polished by the first polishing operation is being passed through guide rolls, a rotary buff for carrying out the second mechanical polishing is arranged against the matte side thereof to thereby effect intended polishing.

In this second buffing, the buff is rotated in a single direction at a rotating speed of generally 100 to 2000 rpm, preferably 800 to 1500 rpm, to thereby effect intended mechanical polishing. The rotating speed of buff in the second mechanical polishing operation, although can be set independently of the rotating speed of buff in the first mechanical polishing operation, is preferably set higher than the rotating speed of buff in the first mechanical polishing in the present invention. When the rotating speed of buff is less than 100 rpm, it may be difficult to uniformly polish the matte side to be polished. On the other hand, when the rotating speed is much greater than 2000 rpm, the buff rotation becomes unstable, so that the electrodeposited copper foil may be broken. Further, it is preferred that the direction of buff rotation be reverse to that of the first mechanical polishing. The reason is as follows. When the matte side of the electrodeposited copper foil is polished by means of a rotary buff, referring to FIG. 4(A), apex portions 110 of the protrudent parts may be deformed along the direction of buff rotation into morphology 111 as shown in FIG. 4(B). The greater the buff press force, the larger the deformation 111. Referring to FIG. 4(B), at the small press force as applied in the first buffing of the present invention, large deformation would not occur but there is the possibility of slight deformation. When the matte side having this deformation 111 produced is, for example, treated for roughening (described in detail later), there may occur disadvantages such that nodules are formed in excess on the shelf shaped deformation portions 111 while preferred nodules are not formed under the shelf shaped deformation. Therefore, referring to FIG. 4(C), it is preferred that, with respect to the prepared matte side, the upper surface of polished protrudent parts form a plateau as designated 112.

For causing the upper surface of polished protrudent parts to form a plateau as mentioned above, it is preferred that the direction of buff rotation employed in the second buffing be reverse to that employed in the first buffing.

Although the press force exerted in the second buffing can be appropriately regulated so as to avoid breakage of the electrodeposited copper foil and simultaneously avoid excess polishing of the matte side independently of the press force exerted in the first buffing, generally, the second buff press force in terms of buff motor current value is set so as to be less than 19 A, preferably in the range of from 11 to less than 19 A (the buff motor current value at the time of non-load is about 10 A, so that the substantial press force of second buffing in terms of buff motor current value is less than 9 A, preferably in the range of from 1 to less than 9 A). When the press force in terms of buff motor current value exceeds 9 A, breakage of the electrodeposited copper foil may become frequent. On the other hand, when the press force is less than 1 A, either may effective polishing of the electrodeposited copper foil be infeasible, or the time required for polishing is prolonged.

Further, it is preferred that the press force exerted in the second buffing be smaller than that exerted in the first buffing. Rendering the buff press force smaller than in the first buffing enables realizing an increasingly uniform surface preparing which is free from the occurrence of rotary buff polishing streaks, etc. on the polished matte side of the electrodeposited copper foil.

The above second mechanical polishing is generally carried out by the use of the above rotary buff. In this mechanical polishing, in the use of the buff, the employed polishing material, although the type thereof is not particularly limited, can be, for example, a buff material of generally No. 1000 to 3000 or so, preferably No. 1200 to 3000 or so, having aluminum oxide bonded thereto in the present invention. That is, use is made of the buff whose abrasive grain is finer than in the first mechanical polishing, and this enables increasingly smooth surface preparing.

The above second mechanical polishing selectively polishes relatively high apex portions of the protrudent parts of the matte side. For example, polishing is performed so as to realize a reduction of $C_1=3$ $\mu$m for which reference is made to FIG. 2 to $C_2=2$ $\mu$m for which reference is made to FIG. 3. That is, the second polishing causes $C_2$ to realize a reduction of 50 to 80% relative to the $C_0$ prior to surface preparing. Thus, since the first mechanical polishing causes $C_1$ to realize a reduction of 30 to 50% relative to $C_0$, the second mechanical polishing causes $C_2$ to realize a reduction of 30 to 60% relative to $C_1$. The thus performed second polishing is evaluated by the average surface roughness. For example, with respect to the electrodeposited copper foil of FIG. 1, the original average surface roughness ($Rz_0$) is 4.5 $\mu$m, and the first mechanical polishing reduces the same to an average surface roughness ($Rz_1$) of 2.5 $\mu$m as shown in FIG. 2. Thus, the first mechanical polishing lowers the average surface roughness ($Rz_1$) by 40 to 600%. The second mechanical polishing reduces the same to an average surface roughness ($Rz_2$) of 1.0 $\mu$m as shown in FIG. 3. Thus, the second mechanical polishing causes the average surface roughness ($Rz_2$) to attain a reduction of 50 to 70% relative to the average surface roughness ($Rz_1$) realized by the first mechanical polishing.

Figure 9:
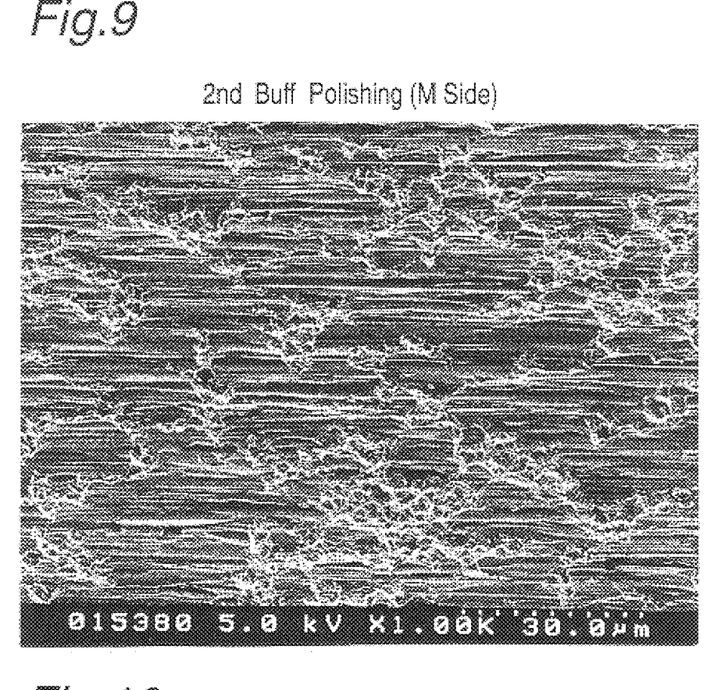
FIG. 9 is an SEM photograph showing one form of the matte side of an 18 $\mu$m thick electrodeposited copper foil with its surface prepared, having undergone the second mechanical polishing.

FIG. 9 is an SEM photograph showing the matte side of the 18 $\mu$m thick electrodeposited copper foil (electrodeposited copper foil with its surface prepared) having undergone the second mechanical polishing.

In the present invention, the third and further-stage mechanical polishings can be performed under conditions similar to those of the second mechanical polishing. When a plurality of mechanical polishings are carried out, it is preferred that polishing conditions be moderated in sequence.

When a comparison is made between the plurality of mechanical polishings and one-time mechanical polishing, both achieving the same level of polishing, the former provides a smoother polished surface. In particular, if the same level of polishing must be attained by one mechanical polishing, it is needed to expose the electrodeposited copper foil to severe polishing conditions, such as increased buff press force and prolonged buff contact time under large press force. Therefore, when polishing of the electrodeposited copper foil must be accomplished by one mechanical polishing, excess stress may be exerted on the electrodeposited copper foil during polishing to thereby cause breakage thereof, and polishing streaks may occur along the buff rotation on the electrodeposited copper foil. However, not only can breakage of the electrodeposited copper foil be avoided but also the occurrence of polishing streaks can be suppressed by carrying out the plurality of mechanical polishings as in the present invention.

Assuming that the average thickness of the electrodeposited copper foil before mechanical polishings is 100%, the average thickness of the electrodeposited copper foil whose matte side has been subjected to the plurality of mechanical polishings as in the present invention is generally in the range of 90 to 98%, preferably 95 to 97%. These values suggest that the polishings are effected only to such an extent that most of the protrudent parts of the matte side of the electrodeposited copper foil have the upper surface thereof modified to flat plateau configuration. Therefore, even when use is made of an extremely thin electrodeposited copper foil (for example, average thickness: 9 to 15 $\mu$m), substantial decreases of the strength, etc. of the electrodeposited copper foil attributed to polishing can be avoided by virtue of the plurality of mechanical polishings of the matte side.

Figure 5:
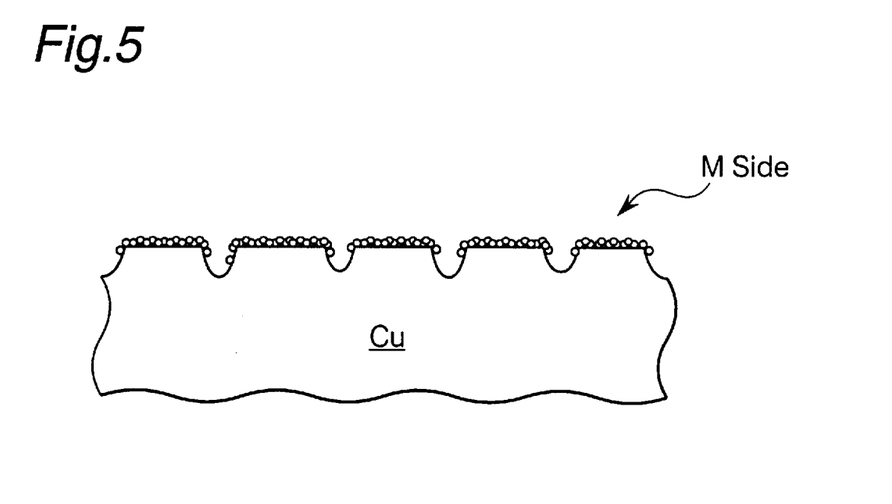
FIG. 5 is a view schematically showing the state of the electrodeposited copper foil with its surface prepared that has been treated for roughening.

In the present invention, after the preparing of the matte side of the electrodeposited copper foil by the plurality of mechanical polishings, it is preferred that the prepared matte side be treated for roughening as shown in FIG. 5.

This treatment sticks fine particles of copper to the thus prepared matte side. In this treatment, fine particles of copper are formed on the prepared matte side by the use of plating techniques conducted under different conditions in combination.

For enhancing the adherence of the copper foil to an insulating substrate, it is preferred that the mechanically polished surface of the copper foil be treated so that the average surface roughness (Rz) falls within the range of 1.5 to 4.0 $\mu$m, especially 1.5 to 3.5 $\mu$m, and still especially 1.5 to 2.5 $\mu$m. The matte side can be uniformly polished by the plurality of mechanical polishing operations, and the resultant uniform polished surface facilitates uniform deposition of fine copper particles.

In this treatment, electrodeposition of nodular copper particles occurs preferentially from apex portions of the uneven protrudent parts of the matte side of the electrodeposited copper foil. Therefore, when the apex portions of the protrudent parts of the matte side are flatly polished by the above at least two mechanical polishings, fine copper particles are uniformly electrodeposited at a high density on the plateau upper surface of the protrudent parts.

This treatment comprises a sequence of burn plating, seal plating and whisker plating. This sequence of plating operations is carried out under, for example, the following conditions.

(1) Burn Plating

An insoluble electrode is arranged opposite to the treatment side of an electrodeposited copper foil which has been prepared by buffing, and electroplating is carried out under the following conditions:

copper concentration: 3 to 30 g/lit.,
sulfate concentration: 50 to 500 g/lit.,
solution temperature: 20 to 30° C.,
current density: 20 to 40 A/dm², and
time: 5 to 15 sec.

A layer of particulate copper electrodeposits known as "burn plating" is formed on the treatment side (matte side) of the electrodeposited copper foil with its surface prepared by the electroplating conducted under these conditions.

(2) Seal Plating

Subsequently, the surface having undergone the above burn plating is subjected to a seal plating conducted under the following conditions:

copper concentration: 40 to 80 g/lit.,
sulfate concentration: 50 to 150 g/lit.,
solution temperature: 45 to 55° C.,
current density: 20 to 40 A/dm², and
time: 5 to 15 sec.

The above layer of particulate copper electrodeposits is coated with a thin film of copper known as "seal plating" by the electroplating conducted under these conditions.

(3) Whisker Plating

Thereafter, the surface having undergone the above seal plating is subjected to a whisker plating conducted under the following conditions:

copper concentration: 5 to 30 g/lit.,
sulfate concentration: 30 to 60 g/lit.,
solution temperature: 20 to 30° C.,
current density: 10 to 40 A/dm², and
time: 5 to 15 sec.

Whiskery copper deposits known as "whisker plating" are formed on the copper covering film having been formed by the above seal plating by the electroplating conducted under these conditions.

The above describes only an example of roughening treatment, and desired nodulation can be effected under other customarily employed roughening treatment conditions.

Figure 10:
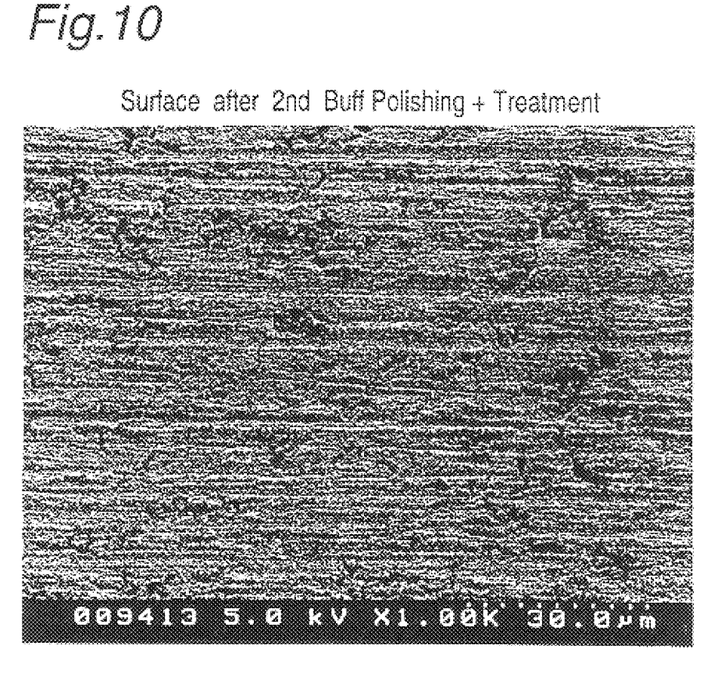
FIG. 10 is an SEM photograaph showing one form of the matte side of an 18 $\mu$m thick electrodeposited copper foil with its surface prepared that has been treated for roughening.

FIG. 10 is an SEM photograph showing the electrodeposited copper foil with its surface prepared and treated, the matte side of which has undergone two mechanical polishings and has been treated for roughening.

The prepared and treated matte side of the electrodeposited copper foil is preferably passivated after the treatment for roughening. This passivation sticks a metal which is electrochemically baser than copper, such as zinc, nickel, tin or chromium, to the above treated surface. For example, a thin plating layer of a metal having corrosion preventive properties for copper is formed on the treated surface.

In particular, for example, the zinc and/or chromate based passivation can be accomplished by a sequence of operations consisting of treating an electrodeposited copper foil with its surface prepared by the above at least two mechanical polishings, passing the treated electrodeposited copper foil through a zinc plating bath and performing chromate treatment.

Employable zinc treatment conditions are, for example, as follows. Zinc treatment may comprise performing zinc plating at a current density of 5 A/dm² for 8 sec in, for example, a 25° C. electrolytic solution having a zinc concentration of 5 g/lit. and a sulfate concentration of 50 g/lit.

After the formation of a zinc plating layer, the surface of the zinc plating layer is subjected to a chromate treatment. Chromate treatment conditions are, for example, as follows. Chromate treatment may comprise electrolytic chromating at a current density of 1 A/dm² for 5 sec in a pH 4 electrolytic solution having a chromic anhydride concentration of 2 g/lit. Finally, the surface having undergone the above chromate treatment is coated with, for example, a silane compound such as γ-glycidoxypropyltrimethoxysilane as a silane coupling agent.

The 18 μm electrodeposited copper foil thus having undergone the passivation after the treatment for roughening generally has an average thickness of 16 to 20 μm, preferably 17 to 19 μm. Assuming that the average thickness of the electrodeposited copper foil before surface preparing is 100%, the average thickness of the thus prepared electrodeposited copper foil with its surface prepared (preferably, the electrodeposited copper foil with its surface prepared and treated for roughening) is generally in the range of 90 to 98%, preferably 95 to 97%. This means that there is no conspicuous polishing loss of copper. Moreover, the average surface roughness (Rz) of the matte side of the thus obtained electrodeposited copper foil with its surface prepared and treated (electrodeposited copper foil with its surface prepared, obtained by performing the nodulating treatment after the polishings) is generally in the range of 1.5 to 4.0 μm, preferably 1.5 to 3.5 μm, and especially preferably 1.5 to 2.5 μm. Therefore, at the bonding to an insulating substrate through an adhesive layer or at the lamination to an insulating substrate without the use of any adhesive, a very uniform and high peel strength is realized between the insulating substrate and the electrodeposited copper foil with its surface prepared and treated.

Figure 4:
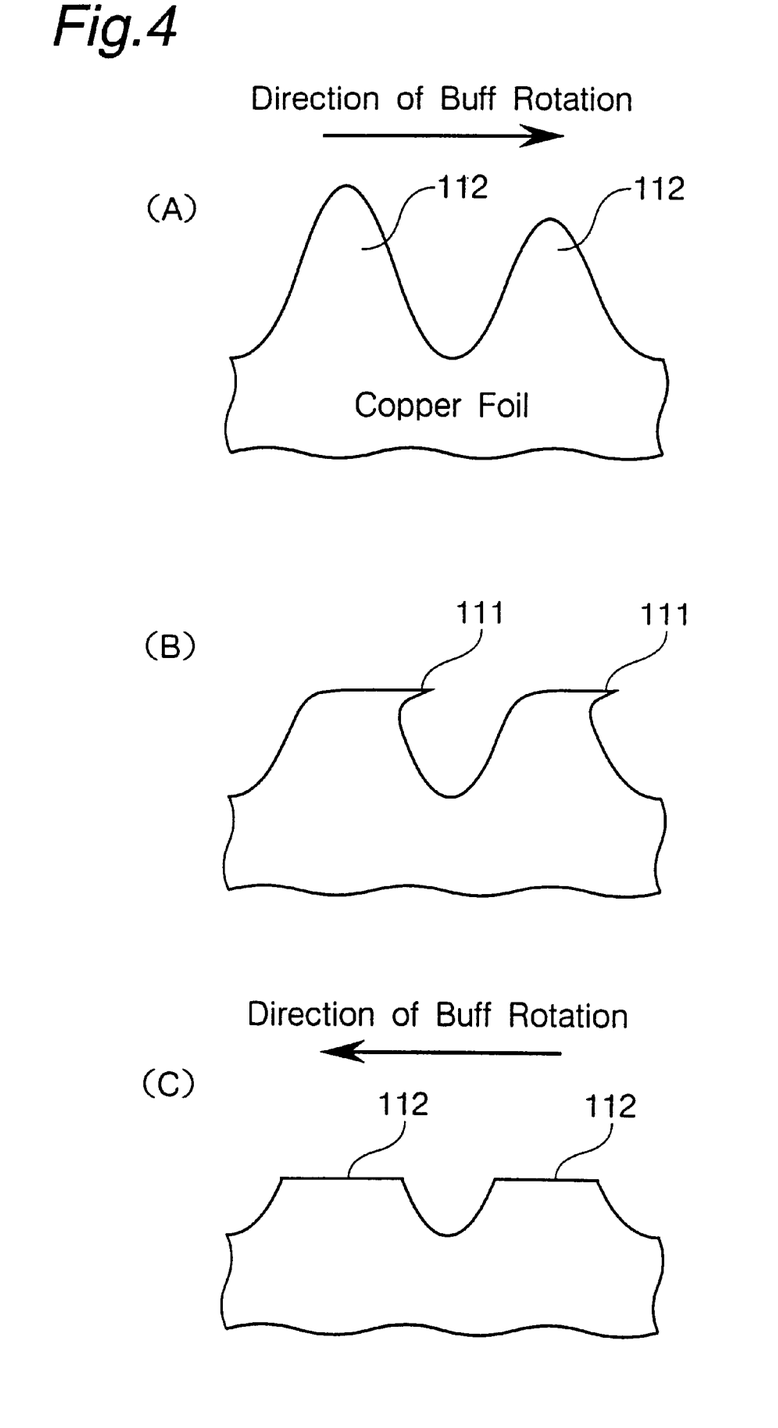
FIGS. 4(A) to (C) are cross-sectional views schematically showing the deformation of protrudent parts made at buffing.

The performing of at least two mechanical polishings accomplishes selective polishing of the protrudent parts of the matte side and realizes plateau configuration, so that, as shown in, for example, FIG. 4, extremely uniform nodulating treatment can be performed on the polished surface of the protrudent parts having been polished into plateau configuration.

In the process of the present invention, the matte side of the electrodeposited copper foil is selectively mechanically polished, so that the surface roughness of the shiny side is not changed by the surface preparing. The average surface roughness (Rz) of the final shiny side is generally the same as before the surface preparing, and ranges from 0.5 to 3.5 μm.

A board comprising an insulating substrate and, superimposed thereon, a wiring pattern, such as a printed circuit board and a printed wiring board, can be formed by the use of the thus produced electrodeposited copper foil with its surface prepared, preferably electrodeposited copper foil with its surface prepared and treated for roughening.

Figure 6:
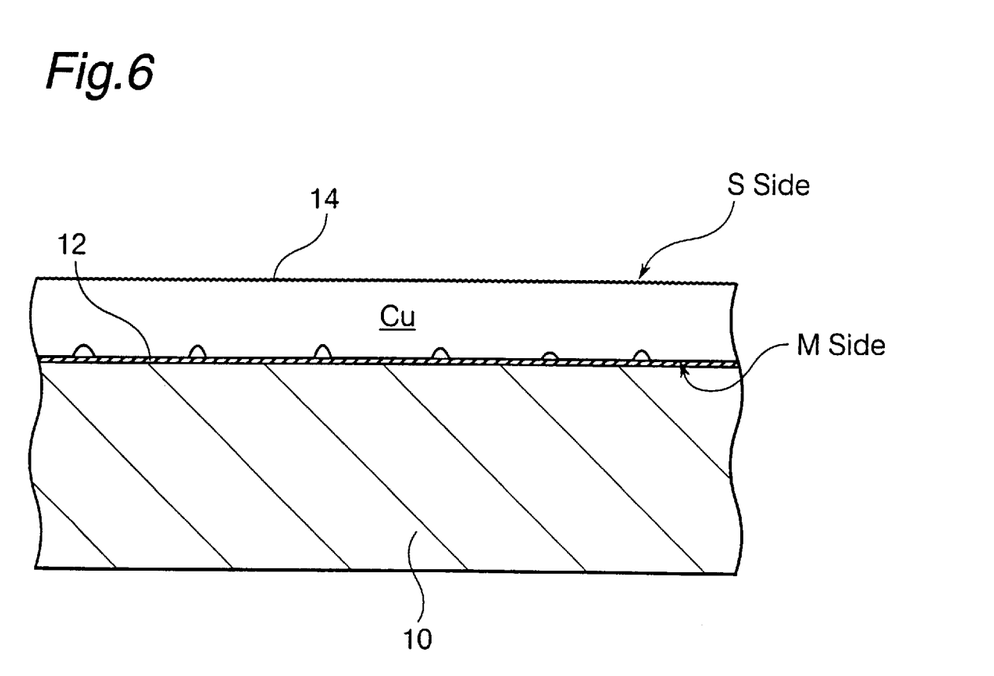
FIG. 6 is a view schematically showing the electrodeposited copper foil with its surface prepared of the present invention, having been stuck to a polyimide film.

FIG. 6 is a schematic sectional view showing one form of printed wiring board (PWB) in which use is made of the electrodeposited copper foil with its surface prepared, preferably electrodeposited copper foil with its surface prepared and treated, according to the present invention.

Referring to FIG. 6, the PWB of the present invention comprises insulating substrate 10 and, superimposed on at least one side thereof, wiring pattern 14. This wiring pattern can be formed by first laminating the insulating substrate with the electrodeposited copper foil with its surface prepared, preferably electrodeposited copper foil with its surface prepared and treated, through an adhesive or without the use of any adhesive, and thereafter etching the copper foil to realize desired pattern. The electrodeposited copper foil with its surface prepared, preferably electrodeposited copper foil with its surface prepared and treated, is laminated to the insulating substrate so that the prepared matte side faces the insulating substrate.

The insulating substrate 10 can be laminated with the electrodeposited copper foil with its surface prepared (preferably electrodeposited copper foil with its surface prepared and treated) by compressing them to each other while heating with or without a thermosetting adhesive 12 interposed therebetween.

Various substrates such as a glass, a synthetic resin and a paper/synthetic resin can be employed as the insulating substrate 10 for use in the present invention. It is preferred that the employed insulating substrate have a chemical resistance ensuring freedom from deterioration by chemical solutions from the viewpoint that the insulating substrate is brought into contact with an acid, etc. at the time of etching. Further, it is preferred that the insulating substrate have a heat resistance ensuring freedom from deterioration by heating made at the time of bonding of devices, etc. The insulating substrate can be produced from various resins, examples of which include an epoxy, a BT (B is maleimide-triazine), polyesters, polyamides, fluororesins (e.g., Teflon (trade name)), liquid crystal polymers and polyimides. Especially in the present invention, when a flexible insulating substrate is employed as the insulating substrate, it is preferred to use a film insulating substrate composed of a polyimide.

The polyimide film for constituting the insulating substrate 10 can be produced from, for example, a totally aromatic polyimide synthesized from pyromellitic acid dianhydride and an aromatic diamine or a totally aromatic polyimide of biphenyl skeleton synthesized from biphenyltetracarboxylic acid dianhydride and an aromatic diamine. Especially in the present invention, a totally aromatic polyimide of biphenyl skeleton (e.g., Upilex (trade name) produced by Ube Industries, Ltd.) is preferably used as the polyimide. The thickness of the insulating substrate 10 in film form is generally in the range of 25 to 125 $\mu$m, preferably 50 to 75 $\mu$m.

The insulating substrate 10, depending on the use thereof, may be furnished with through-holes such as device holes, sprocket holes and outer lead cut holes. These through-holes are generally formed by punching.

The wiring-pattern 14 can be formed by first laminating the above insulating substrate 10 furnished with needed holes with the electrodeposited copper foil with its surface prepared (preferably electrodeposited copper foil with its surface prepared and treated) through an insulating adhesive 12 so that the prepared matte side of the electrodeposited copper foil contacts the adhesive layer 12, subsequently applying a resist, and thereafter etching the electrodeposited copper foil with its surface prepared (preferably electrodeposited copper foil with its surface prepared and treated).

The lamination of the insulating substrate with the electrodeposited copper foil with its surface prepared (preferably electrodeposited copper foil with its surface prepared and treated) can be performed with the use of an adhesive or without any adhesive layer interposed therebetween. In the use of an adhesive, the employed adhesive 12 must have properties such as heat resistance, chemical resistance, bond strength and flexibility. For example, epoxy adhesives and phenol adhesives can be mentioned as the adhesive having these properties. These adhesives may be those modified with a urethane resin, a melamine resin, a polyvinylacetal resin and the like, and the epoxy resin per se may be one modified with a rubber. These adhesives are thermosetting. These adhesives are applied in the form of a layer whose thickness is generally in the range of 3.7 to 23 $\mu$m, preferably 10 to 21 $\mu$m. When use is made of the adhesives, the adhesive layer may be applied to the surface of the insulating substrate 10, or to the adherend matte side of the electrodeposited copper foil with its surface prepared.

Photoresist is applied to the surface of the electrodeposited copper foil with its surface prepared (preferably electrodeposited copper foil with its surface prepared and treated) thus superimposed on the insulating substrate 10 by lamination. Wiring pattern is printed, and development is conducted to thereby remove excess photoresist, followed by etching. Thus, the wiring pattern 14 is obtained.

After the formation of the wiring pattern on the surface of the insulating substrate 10 in the above manner, a protective resin such as a solder resist can be applied to parts other than bonding or connecting parts (lead parts) for device bonding. After the application of the protective resin, the lead parts for device bonding are subjected to nickel/gold plating, tin plating, solder plating or gold plating. Although in most cases the protective resin is first applied and subsequently the parts not furnished with the protective resin are plated as mentioned above, it is feasible to first form a thin plating layer of the above metal on the surface of wiring pattern formed prior to the application of protective resin, next apply a protective resin and thereafter plate lead parts extending out of the protective resin, for example, in order to prevent any whisker generation and to avoid any abnormal corrosion of wiring pattern by the plating solution. This plating method is useful especially when the tin plating which is likely to invite whisker generation is employed.

After the above formation of the plating layer, device mounting can be carried out by the use of any of conventional methods, such as the wire bonding method, TAB (Tape Automated Bonding) method and flip chip bonding method. After the device mounting, generally, the device carrying PWB (printed wiring board) is sealed with the application of a seal resin to the devices connected to PWB by soldering, BGA (Ball Grid Array) method, Anisotropic Conductive Film method, etc. altogether and put to practical use.

In the present invention, a multilayer laminate can be provided by laminating the above PWBs and by securing electrical connection in the direction of the laminate thickness. The electrical connection in the direction of the laminate thickness can be secured by various methods, for example, the method comprising making intended via holes in PWBs by, for example, a drill or laser and either depositing a conductive metal on the wall of the via holes or charging a conductive resin composition containing a conductive metal into the via holes, or the method comprising forming conductive protrusions on PWBs with the utilization of printing technique and mutually connecting the conductive protrusions.

The electrodeposited copper foil with its surface prepared according to the present invention is suitable for use in PWBs, such as TAB tapes, flexible printed wiring boards, multilayer printed wiring boards and rigid flex. In view of strikingly uniform conditioning of the matte side together with uniform treatment thereof for roughening, the electrodeposited copper foil with its surface prepared according to the present invention is especially suitable for use as an extremely thin electrodeposited copper foil whose consumption is expected to increase in accordance with the recent trend toward fine pitch.

EFFECT OF THE INVENTION

In the production of the electrodeposited copper foil with its surface prepared according to the present invention, apex portions of the protrudent parts of the matte side are selectively polished by at least two mechanical polishings of the matte side. The protrudent parts of the matte side are selectively polished by the first mechanical polishing under mild conditions, and further apex portions of the protrudent parts having undergone the first mechanical polishing are polished by the second and ensuing mechanical polishings under milder conditions than in the first mechanical polishing. Thus, an extremely planar polished surface can be obtained. Moreover, in the present invention, the depressed parts are not polished by the selection of mechanical polishings, so that the amount of copper loss caused by the polishing is extremely minute.

This conditioning of the matte side enables performing uniform nodulating treatment of the prepared matte side. Thus, PWB which is highly excellent in bond strength, bonding reliability and other properties can be obtained.

In the process of the present invention, the matte side of the electrodeposited copper foil is subjected to a plurality of mechanical polishings performed under mild conditions, so that the occurrence of polishing streaks and the like on the mechanically polished matte side can be suppressed. The polishing streaks are generally attributed to excess polishing, and the electrodeposited copper foil is thinner there than at other parts. Thus, when the electrodeposited copper foil having polishing streaks is employed is the use of an extremely thin copper foil in accordance with the trend toward fine pitch, the mechanical strength of wiring pattern there is reduced with the result that the polishing streak portions are likely to become the cause of failure such as an open circuit. The electrodeposited copper foil with is surface prepared, produced by the process of the present invention, is free from such polishing streaks attributed to excess polishing so that, with respect to wiring boards such as PWB produced with the use of the prepared electrodeposited copper foil, the occurrence of defective items attributed to such an open circuit or the like is strikingly low.

Moreover, when the electrodeposited copper foil with its surface prepared according to the present invention is formed into a wiring pattern through superimposing the same on an insulating substrate by laminating or bonding, resist application and etching, the difference between upper edge width and lower edge width of the formed wiring (especially lead parts) is minute. Thus, a wiring of approximately rectangular cross section can be formed. In the use of the conventional electrodeposited copper foil, the lower edge width tends to be larger than the upper edge width in the formed wiring, thereby causing the cross section configuration to be trapezoidal. However, in the use of the electrodeposited copper foil with its surface prepared according to the present invention, the above trend is eliminated, and a wiring of approximately rectangular cross section can be obtained. Furthermore, the lower edge portions of the wiring are etched linearly, and there is substantially no copper residue on the insulating substrate. These characteristics, although important in, for example, inner leads as well, are especially important in output side outer leads electrically connected to liquid crystal elements, and the like. With respect to the output side outer leads electrically connected to liquid crystal elements, a plurality thereof are connected to liquid crystal pixels, and not only is the lead width thereof extremely small but also the pitch is rendered small. Accordingly, the output side outer leads are likely to suffer from insulation failure between neighboring leads. For example, even if the linearity of output side outer leads is slightly deteriorated, there is the danger of insulation failure. Further, if the lower edge is slightly wider than the upper edge in the output side outer leads, there is the danger of insulation failure on the surface of the insulating substrate. Still further, even if slight copper residue exists on the insulating substrate, there is the danger of insulation failure. In the output side outer lead parts of PWBs (especially TAB tape) connected to liquid crystal elements, etching of the copper foil must be effected with precision equal to or higher than that for inner leads for mounting electronic components. Especially, with respect to the output side outer leads of the TAB tape for liquid crystal elements, these must be formed on an insulating substrate by etching the electrodeposited copper foil disposed on the insulating substrate by laminating, so that each of the leads is likely to have a trapezoidal cross section as compared with inner leads which extend out into device holes and under which any insulating substrate is not present. Further, due to the presence of the insulating substrate, copper residue is likely to occur. Therefore, it is believed that the realization of fine pitch is more difficult in the output side outer leads than in the inner leads.

However, the above realization of fine pitch in the output side outer leads can be facilitated by the use of the electrodeposited copper foil with its surface prepared according to the present invention. Specifically, by virtue of the use of the electrodeposited copper foil with its surface prepared according to the present invention, not only do the output side outer leads formed by etching have a rectangular cross section (upper edge width being substantially the same as the lower edge width) but also the linearity of formed leads is high. Further, there is no copper residue on the surface of the insulating substrate. Although the particular reason for the above excellent etching properties of the electrodeposited copper foil with its surface prepared according to the present invention has not yet been elucidated, specific exertion of the above effects of the present invention would be brought about by the plurality of mechanical polishings.

In the electrodeposited copper foil with its surface prepared according to the present invention, as aforementioned, the matte side is highly uniformly prepared, and uniform nodulation can be accomplished by treating the uniform matte side. By virtue of this uniform nodulation, not only can desirable bonding to an insulating substrate be attained but also device mounting on PWB can be secured by plating the thus uniformly nodulated surface. For example, with respect to TAB tapes, inner leads and the like are plated with tin, and tin supplied from the tin plating layer cooperates with gold supplied from device bumps to thereby form a tin/gold eutectic, this eutectic realizing electrical connection of the TAB tape inner leads with the bumps. By virtue of the preparing of the matte side according to the process of the present invention, the amounts of tin supplied from the formed tin plating layer and gold supplied from bumps are appropriate. Therefore, even when the lead width is reduced in accordance with the trend for fine pitch, there is no excess supply of eutectics from neighboring lead junctions, and accordingly there is no formation of a short circuit by outflow of excess eutectic in the lateral direction of the leads.

Moreover, when, for example, wire bonding is performed, plating with a hard metal such as nickel is carried out along the electrodeposited copper foil with its surface prepared, which plating is followed by gold plating. Gold wire used in wire bonding and gold of the gold plating layer are fusion bonded to each other with the application of ultrasonic wave. At this wire bonding, the larger the gold crystal grain, the higher the bonding reliability between gold wire and gold plating layer.

As apparent from the above, the electrodeposited copper foil with its surface prepared, obtained by the process of the present invention, ensures not only high adherence to insulating substrates but also strikingly high yield of device mounting on boards.

EXAMPLE

The present invention will now be illustrated in greater detail with reference to the following Example, which in no way limits the scope of the invention.

Example 1

An electrodeposited copper foil of 18 μm (gauge thickness) average thickness having an average surface roughness of shiny side of 1.6 μm and an average surface roughness ($Rz_1$) of matte side of 4.5 μm (18 μm thick electrodeposited copper foil) was provided. An SEM photograph of the matte side of the 18 μm thick electrodeposited copper is shown in FIG. 7.

While the electrodeposited copper foil was being passed through guide rolls, the matte side thereof was subjected to the first buffing conducted by means of #1000 buff comprising aluminum oxide as abrasive grains (manufactured by Tsunoda Brush K.K.) under conditions such that the rotating speed, press force and line speed were 1100 rpm, 19 A and 10 m/min, respectively (the first mechanical polishing). With respect to the electrodeposited copper foil before the first mechanical polishing, the distance between the highest apex of the protrudent parts and the deepest bottom of the depressed parts was 6 μm. The average surface roughness thereof was 2.3 μm. An SEM photograph of the matte side of the 18 μm thick electrodeposited copper foil having undergone the first mechanical polishing is shown in FIG. 8.

After the completion of the first mechanical polishing, while the electrodeposited copper foil having undergone the first mechanical polishing was being passed through guide rolls, the matte side thereof was subjected to the second buffing conducted by means of #2500 buff comprising aluminum oxide as abrasive grains (manufactured by Tsunoda Brush K.K.) under conditions such that the rotating speed, press force and line speed were 1200 rpm, 18 A and 10 m/min, respectively (the second mechanical polishing). With respect to the electrodeposited copper foil before the second mechanical polishing, the distance between the highest apex of the protrudent parts and the deepest bottom of the depressed parts was 3 μm. The average surface roughness (Rz) thereof was 1.1 μm. An SEM photograph of the matte side of the 18 μm thick electrodeposited copper foil having undergone the second mechanical polishing is shown in FIG. 9.

The electrodeposited copper foil with its surface prepared in the above manner had a thickness (gauge thickness) of 17.5 μm. The amount of copper ground by the two mechanical polishings was 0.5 μm (calculated value), only 3% by weight of copper relative to the total copper weight was lost by mechanical polishings twice.

The thus obtained electrodeposited copper foil with its surface prepared was visually inspected. No polishing streak was detected, and the surface thereof was highly smooth. Further, an SEM photograph of the surface of the electrodeposited copper foil with its surface prepared was observed, and it was found that the apex portions of the protrudent parts constituting the matte side had been selectively polished and that most of the thus polished protrudent parts had plateau configuration.

The thus obtained electrodeposited copper foil with its surface prepared was treated for roughening. This treatment comprised the following sequence of plating operations consisting of burn plating, seal plating and whisker plating.

(1) Burn Plating

An insoluble electrode was arranged opposite to the buffed matte side of the electrodeposited copper foil, and electroplating was carried out under the following conditions:

copper concentration: 5 to 30 g/lit.,
sulfate concentration: 50 to 150 g/lit.,
solution temperature: 20 to 30° C.,
current density: 20 to 40 A/dm$^2$, and
time: 5 to 15 sec.

A layer of particulate copper electrodeposits known as "burn plating" was formed on the matte side of the electrodeposited copper foil with its surface prepared by the electroplating conducted under these conditions.

(2) Seal Plating

Subsequently, the surface having undergone the above burn plating was subjected to a seal plating conducted under the following conditions:

copper concentration: 40 to 80 g/lit.,
sulfate concentration: 50 to 150 g/lit.,
solution temperature: 45 to 150° C.,
current density: 20 to 40 A/dm$^2$, and
time: 5 to 15 sec.

The surface of the above layer of particulate copper electrodeposits was coated with a thin film of copper known as "seal plating" by the electroplating conducted under these conditions.

(3) Whisker Plating

Thereafter, the surface having undergone the above seal plating was subjected to a whisker plating conducted under the following conditions:

copper concentration: 3 to 30 g/lit.,
sulfate concentration: 30 to 60 g/lit.,
solution temperature: 20 to 30° C.,
current density: 10 to 40 A/dm$^2$, and
time: 5 to 15 sec.

Whiskery copper deposits known as "whisker plating" were formed on the copper covering film having been formed by the above seal plating by the electroplating conducted under these conditions.

The average surface roughness (Rz) of the thus treated matte side was 2.3 μm. The average thickness of the electrodeposited copper foil with its surface prepared and treated in the above manner was 19.2 μm.

After the above treatment of the surface of the thus obtained electrodeposited copper foil with its surface prepared, the treated surface was passivated with zinc. The zinc passivation was performed at a current density of 5 A/dm$^2$ for 8 sec in a 25° C. electrolytic solution having a zinc concentration of 5 g/lit. and a sulfate concentration of 50 g/lit. The formed zinc layer was extremely thin, and the thickness thereof was generally 0.05 μm or less.

After the above formation of the zinc layer, the passivated surface was subjected to an electrolytic chromating conducted at a current density of 1 A/dm$^2$ for 5 sec in a pH 4 electrolytic solution having a chromic anhydride concentration of 2 g/lit. After the chromate treatment, the surface of the chromate layer was coated with γ-glycidoxypropyltrimethoxysilane as a silane coupling agent.

PWB was produced with the use of the thus obtained electrodeposited copper foil with its surface prepared.

Specifically, the electrodeposited copper foil with its surface prepared (after the removal of the passivation layer, chromate layer and silane coupling agent layer) was bonded by hot pressing to a 125 μm thick polyimide film (with a thermosetting adhesive).

Subsequently, a photosensitive resin was applied to the electrodeposited copper foil with its surface prepared and exposed to radiation in desired wiring pattern, and unneeded parts were dissolved away.

Thereafter, non-masked part copper was leached away by bringing it into contact with an etching solution, thereby forming desired wiring pattern on the insulating film. In this procedure, a plurality of PWBs were produced. According to conventional techniques, vertical holes were formed through a laminate of a plurality of obtained PWBs in the direction of the laminate thickness, and copper was electrodeposited on the inner cylindrical surface of the via holes to thereby secure electrical connection along the depth.

The PWB such as TAB tape, multilayer laminate and flexible printed wiring board, produced with the use of the electrodeposited copper foil with its surface prepared according to the present invention in the above manner, exhibit low failure ratio and excellent properties.

What is claimed is:

1. A process for producing an electrodeposited copper foil with its surface prepared, comprising the steps of:
   subjecting an electrodeposited copper foil having a shiny side and a matte side whose average surface roughness (Rz) is in the range of 2.5 to 10 μm to a first mechanical polishing so that the average surface roughness (Rz) of the matte side becomes in the range of 1.5 to 6 μm, and
   subjecting the matte side having undergone the first mechanical polishing to at least one further mechanical polishing so that the average surface roughness (Rz) of the matte side becomes in the range of 1.0 to 3.0 μm,
   wherein the matte side having undergone at least the second mechanical polishing in a counter direction of the first polishing direction has its surface substantially without shelf shaped deformation.

2. A process of claim 1, wherein the matte side having undergone the mechanical polishings is treated for roughening.

3. A process of claim 2, wherein the matte side having been treated for roughening has an average surface roughness (Rz) in the range of 1.5 to 4.0 μm.

4. A process of claim 1, wherein the electrodeposited copper foil before the mechanical polishings has an average gauge thickness of 5 to 35 μm while the electrodeposited copper foil having finally undergone the mechanical polishings to thereby have its surface prepared has an average gauge thickness of 4 to 34 μm.

5. A process of claim 1, wherein the matte side having undergone the mechanical polishings is treated to thereby form a roughened layer, and a corrosion preventive layer is formed on the roughened layer.

6. A process of claim 5, wherein the corrosion preventive layer comprises a zinc layer and, superimposed thereon, a chromate layer.

7. A process of claim 6, wherein a silane coupling agent layer is formed on the chromate layer of the corrosion preventive layer.

8. An electrodeposited copper foil with its surface prepared, having a shiny side and a prepared matte side whose average surface roughness (Rz) is in the range of 1.0 to 3.0 μm, said prepared matte side obtained through the steps of subjecting a matte side of electrodeposited copper foil whose average surface roughness (Rz) is in the range of 2.5 to 10 μm to a first mechanical polishing so that the average surface roughness (Rz) of the matte side becomes 1.5 to 6 μm, and subjecting the matte side having undergone the first mechanical polishing to at least one further mechanical polishing so that the average surface roughness (Rz) of the matte side becomes 1.0 to 3.0 μm,
   wherein the matte side having undergone at least the second mechanical polishing in a counter direction of the first polishing direction has its surface substantially without shelf shaped deformation.

9. An electrodeposited copper foil with its surface prepared of claim 8, wherein the matte side having undergone the mechanical polishings has its surface furnished with a roughened layer.

10. An electrodeposited copper foil with its surface prepared of claim 8, wherein the matte side having undergone the mechanical polishings is treated for roughening so as to have an average surface roughness (Rz) of 1.5 to 4.0 μm.

11. An electrodeposited copper foil with its surface prepared of claim 8, wherein the electrodeposited copper foil before the mechanical polishings has an average gauge thickness of 5 to 35 μm while the electrodeposited copper foil having undergone the mechanical polishings to thereby have its surface prepared has an average gauge thickness of 4 to 34 μm.

12. An electrodeposited copper foil with its surface prepared of claim 8, wherein the matte side having undergone the mechanical polishings has its surface furnished with a roughened layer, and a corrosion preventive layer is disposed on a surface of the roughened layer.

13. An electrodeposited copper foil with its surface prepared of claim 12, wherein the corrosion preventive layer comprises a zinc layer and, superimposed thereon, a chromate layer.

14. An electrodeposited copper foil with its surface prepared of claim 13, wherein a silane coupling agent layer is disposed on the chromate layer of the corrosion preventive layer.

15. A printed wiring board comprising an insulating substrate having its surface furnished with a wiring pattern formed from an electrodeposited copper foil with its surface prepared, said electrodeposited copper foil with its surface prepared having a shiny side and a prepared matte side whose average surface roughness (Rz) is in the range of 1.0 to 3.0 μm, said prepared matte side obtained through the steps of subjecting a matte side of electrodeposited copper foil whose average surface roughness (Rz) is in the range of 2.5 to 10 μm to a mechanical polishing so that the average surface roughness (Rz) of the matte side becomes in the range of 1.5 to 6 μm, and subjecting the matte side having undergone the mechanical polishing to at least one further mechanical polishing so that the average surface roughness (Rz) of the matte side becomes in the range of 1.0 to 3.0 μm,
   wherein the matte side having undergone at least the second mechanical polishing in a counter direction of the first polishing direction has its surface substantially without shelf shaped deformation.

16. A printed wiring board of claim 15, wherein the matte side having undergone the mechanical polishings is treated for roughening.

17. A multi-layer printed wiring board comprising a laminate of a plurality of boards of given thickness, said boards capable of being electrically connected to each other in the direction of the thickness of the laminate, each of said boards having its surface furnished with a wiring pattern formed from an electrodeposited copper foil with its surface prepared, said electrodeposited copper foil with its surface prepared having a shiny side and a prepared matte side whose average surface roughness (Rz) is in the range of 1.0 to 3.0 μm, said prepared matte side obtained through the steps of subjecting a matte side of electrodeposited copper foil whose average surface roughness (Rz) is in the range of 2.5 to 10 μm to a mechanical polishing so that the average surface roughness (Rz) of the matte side becomes in the range of 1.5 to 6 μm, and subjecting the matte side having undergone the mechanical polishing to at least one further mechanical polishing so that the average surface roughness (Rz) of the matte side becomes in the range of 1.0 to 3.0 μm,    wherein the matte side having undergone at least the second mechanical polishing in a counter direction of the first polishing direction has its surface substantially without shelf shaped deformation.

18. A multi-layer printed wiring board of claim 17, wherein the matte side having undergone the mechanical polishings is treated for roughening.

19. A process of claim 2, wherein the matte side having undergone the mechanical polishings is treated to thereby form a roughened layer, and a corrosion preventive layer is formed on the roughened layer.

20. An electrodeposited copper foil with its surface prepared of claim 9, wherein the matte side having undergone the mechanical polishings has its surface furnished with a roughened layer, and a corrosion preventive layer is disposed on a surface of the roughened layer.

\* \* \* \* \*

UNITED STATES PATENT AND TRADEMARK OFFICE
CERTIFICATE OF CORRECTION

PATENT NO. : 6,291,081 B1
DATED : September 18, 2001
INVENTOR(S) : Hitoshi Kurabe et al.

Page 1 of 1

It is certified that error appears in the above-identified patent and that said Letters Patent is hereby corrected as shown below:

Column 2,
Line 37, "(½ounce)" should read -- (½ ounce) --.

Column 7,
Line 16, "time require" should read -- time required --.
Lines 20-21, "the range of range of range" should read -- the range of --.

Column 9,
Line 47, "($Rz_1$) by" should read -- (Rz) by --.
Line 47, "40 to 600%" should read -- 40 to 60% --.

Column 15,
Line 24, "is the use" should read -- in the use --.

Signed and Sealed this

Twenty-sixth Day of March, 2002

Attest:

JAMES E. ROGAN
*Attesting Officer*   *Director of the United States Patent and Trademark Office*